(12) United States Patent  (10) Patent No.: US 8,004,276 B2
Nishimura et al.  (45) Date of Patent: Aug. 23, 2011

(54) REFERENCE SIGNAL GENERATION CIRCUIT, ANGLE CONVERTER, AND ANGLE DETECTION APPARATUS

(75) Inventors: Hisashi Nishimura, Tokyo (JP); Kenichi Nakazato, Tokyo (JP)

(73) Assignee: Japan Aviation Electronics Industry Limited, Tokyo (JP)

( * ) Notice: Subject to any disclaimer, the term of this patent is extended or adjusted under 35 U.S.C. 154(b) by 447 days.

(21) Appl. No.: 12/317,094

(22) Filed: Dec. 19, 2008

(65) Prior Publication Data

US 2009/0160436 A1    Jun. 25, 2009

(30) Foreign Application Priority Data

Dec. 25, 2007    (JP) .................. 2007-332231

(51) Int. Cl.
*G01B 7/30* (2006.01)
(52) U.S. Cl. ............... 324/207.25; 341/112; 341/116
(58) Field of Classification Search ........... 324/207.25; 341/112, 116; 318/144
See application file for complete search history.

(56) References Cited

U.S. PATENT DOCUMENTS

2007/0029955 A1* 2/2007 Kanekawa et al. ........... 318/144

FOREIGN PATENT DOCUMENTS

JP    2000-353957    12/2000

* cited by examiner

*Primary Examiner* — Melissa Koval
*Assistant Examiner* — Temilade S Rhodes-Vivour
(74) *Attorney, Agent, or Firm* — David N. Lathrop

(57) ABSTRACT

A reference signal generation circuit generates a reference signal used in synchronous detection for removing an excitation signal component in an angle calculation section that converts a detection angle θ obtained from two-phase resolver detection signals output from a resolver, to a digital output angle φ. The reference signal generation circuit includes a first multiplier, a second multiplier, and an adder. The first multiplier multiplies one of the resolver detection signals sin θ sin(ωt+Δω) by the sine value sin φ of the digital output angle φ obtained from the angle calculation section. The second multiplier multiplies the other resolver detection signal cos θ sin(ωt+Δω) by the cosine value cos φ of the digital output angle φ obtained from the angle calculation section. The adder adds the output of the first multiplier and the output of the second multiplier to output the sum signal sin(ωt+Δω) as the reference signal.

5 Claims, 6 Drawing Sheets

REFERENCE SIGNAL GENERATION CIRCUIT, ANGLE CONVERTER, AND ANGLE DETECTION APPARATUS

BACKGROUND OF THE INVENTION

1. Field of the Invention

The present invention relates to a reference signal generation circuit for generating a reference signal used in synchronous detection for removing an excitation signal component in an angle calculation section that converts a detection angle $\theta$ obtained from two-phase resolver detection signals output from a resolver for detecting a motor rotation angle, to a digital output angle $\phi$, and relates to an angle converter and an angle detection apparatus having the reference signal generation circuit.

2. Description of the Related Art

In tracking loop angle calculation sections (resolver-digital converters, hereinafter called RD converters) for converting a detection signal $\theta$ obtained from two-phase resolver detection signals output from a resolver of the type of one-phase-excitation and two-phase-output, to a digital output angle $\phi$, the detection angle $\theta$ is converted to the digital output angle $\phi$ by making a control deviation $\sin(\theta-\phi)$ zero. To obtain this control deviation $\sin(\theta-\phi)$, it is necessary to remove an excitation signal component from the resolver detection signals. To remove the excitation signal component, synchronous detection is performed with an excitation signal $\sin \omega t$ being used as a reference signal.

The excitation signal component included in the resolver detection signals generally has a phase difference $\Delta\omega$ from the excitation signal $\sin \omega t$ for various reasons. Therefore, if synchronous detection is performed with the excitation signal $\sin \omega t$ being used as a reference signal, the loop gain of the angle detection section is reduced. Therefore, it is desirable that the phase difference $\Delta\omega$ be compensated for.

Japanese Registered Patent No. 3,442,316 (Japanese Patent Laid-Open No. 2000-353957) discloses a method for compensating for such a phase difference $\Delta\omega$. FIG. 9 shows the configuration described in Japanese Registered Patent No. 3,442,316.

In this configuration, two-phase resolver detection signals $\sin \theta \sin(\omega t+\Delta\omega)$ and $\cos \theta \sin(\omega t+\Delta\omega)$ output from a resolver are input to an absolute value comparator 11 and also to a switch 12. The output of the absolute value comparator 11 is sent to the switch 12 as a switching signal. The switch 12 is connected to an edge detector 13 for detecting rising and falling edges. The output of the edge detector 13 is input to a synchronizing circuit 14.

An excitation signal $\sin \omega t$ sent to the resolver is input to a 90 degree and 270 degree signal generator 15 and to a phase adjustment range setter 16. The 90 degree and 270 degree signal generator 15 generates trigger signals indicating the positions of 90 degrees and 270 degrees from rising edges of the excitation signal $\sin \omega t$ and sends the trigger signals to the phase adjustment range setter 16. Although the operation of the phase adjustment range setter 16 is not explicitly described, its output is input to the synchronizing circuit 14 to synchronize the excitation signal $\sin \omega t$ with an edge of a rotation detection signal. With such a configuration, the synchronizing circuit 14 outputs a reference signal $\sin(\omega t+\Delta\omega)$, obtained by shifting the excitation signal $\sin \omega t$ by the phase difference $\Delta\omega$.

As described above, in Japanese Registered Patent No. 3,442,316, the two-phase resolver detection signals are used to generate the reference signal synchronized with the two-phase resolver detection signals to compensate for the phase difference.

In the method described in Japanese Registered Patent No. 3,442,316, however, because the reference signal is generated by zero-crossing edge detection of the signal $\sin \theta \sin(\omega t+\Delta\omega)$ (or $\cos \theta \sin(\omega t+\Delta\omega)$), obtained by amplitude modulating the reference signal by $\sin \theta$ (or $\cos \theta$), the higher the angular velocity at which the resolver rotates, the more the amplitude-modulated waveform is distorted. As a result, the reference signal cannot be generated with the correct phase.

In addition, an edge detection signal at zero crossing also causes a phase shift due to noise intruding in actual use.

SUMMARY OF THE INVENTION

In view of the foregoing situation, an object of the present invention is to provide a reference signal generation circuit capable of generating a reference signal having exactly the same phase as an excitation signal component included in resolver detection signals, and to also provide an angular converter and an angle detection apparatus having such a reference signal generation circuit.

According to a first aspect of the present invention, there is provided a reference signal generation circuit for generating a reference signal used in synchronous detection for removing an excitation signal component in an angle calculation section that converts a detection angle $\theta$ obtained from two-phase resolver detection signals output from a resolver excited by an excitation signal $\sin \omega t$, to a digital output angle $\phi$. The reference signal generation circuit includes a first multiplier for multiplying a first resolver detection signal $\sin \theta \sin(\omega t+\Delta\omega)$ by the sine value $\sin \phi$ of the digital output angle $\phi$ obtained from the angle calculation section; a second multiplier for multiplying a second resolver detection signal $\cos \theta \sin(\omega t+\Delta\omega)$ by the cosine value $\cos \phi$ of the digital output angle $\phi$ obtained from the angle calculation section; and an adder for adding the output of the first multiplier and the output of the second multiplier to output the sum signal $\sin(\omega t+\Delta\omega)$ as the reference signal.

According to a second aspect of the present invention, the reference signal generation circuit provided in the first aspect of the present invention further includes a tracking loop lock signal generator adapted to compare the absolute value of a control deviation $\sin(\theta-\phi)$ obtained from the angle calculation section with a predetermined value to output a comparison result, and a switch for switching between the output $\sin(\omega t+\Delta\omega)$ of the adder and the excitation signal $\sin \omega t$, based on the output of the tracking loop lock signal generator, wherein $\sin(\omega t+\Delta\omega)$ and $\sin \omega t$ are switched between based on the magnitude of the control deviation and are output as the reference signal.

According to a third aspect of the present invention, the reference signal generation circuit provided in the second aspect of the present invention further includes a first comparator adapted to shape the output $\sin(\omega t+\Delta\omega)$ of the adder to a rectangular wave signal; a phase synchronizing circuit adapted to generate a rectangular wave signal having the same phase as the output of the first comparator to send the rectangular wave signal to the switch; and a second comparator adapted to shape the excitation signal $\sin \omega t$ to a rectangular wave signal and to send the rectangular wave signal to the switch.

According to a fourth aspect of the present invention, an angle converter includes an angle calculation section adapted to convert a detection angle $\theta$ obtained from two-phase resolver detection signals output from a resolver to a digital output angle φ, and a reference signal generation circuit provided in one of the first to third aspects of the present invention.

According to a fifth aspect of the present invention, an angle detection apparatus includes a resolver adapted to output two-phase detection signals; an angle converter provided in the fourth aspect of the present invention; and an excitation signal generator adapted to send an excitation signal sin ωt to the resolver.

According to a reference signal generation circuit for synchronous detection of the present invention, it is possible to generate a reference signal that has exactly the same phase as an excitation signal component included in resolver detection signals, without any limitation depending on the rotation speed of the resolver.

DETAILED DESCRIPTION OF THE PREFERRED EMBODIMENTS

Preferred embodiments of the present invention will be described below with reference to the drawings.

Figure 1:
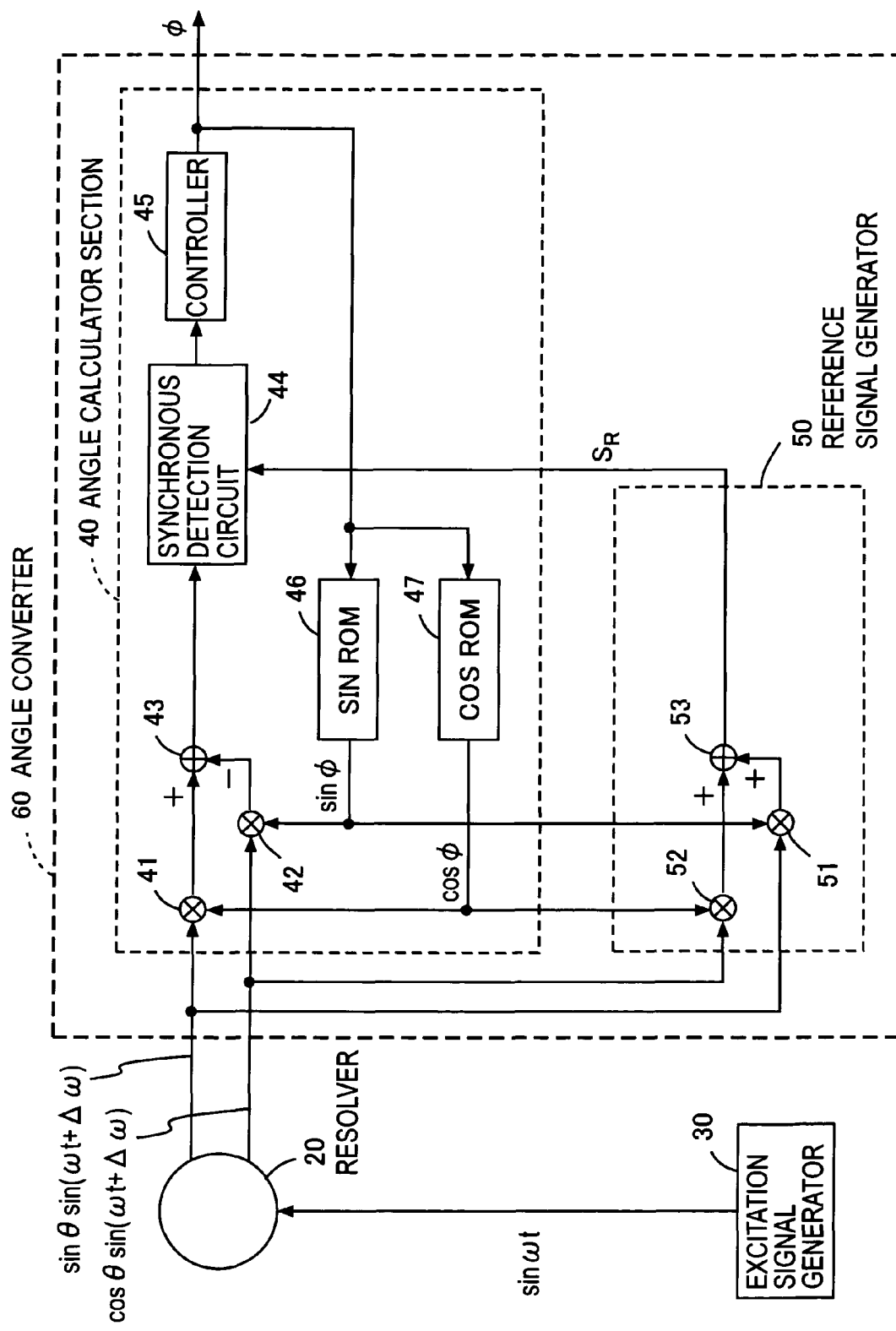
FIG. 1 is a block diagram showing a reference signal generation circuit according to a first embodiment of the present invention.

FIG. 1 shows a reference signal generator 50 according to a first embodiment of the present invention, together with a resolver 20, an excitation signal generator 30, and an angle calculation section 40.

The resolver 20 is a one-phase-excitation and two-phase-output resolver. The resolver 20 receives an excitation signal sin ωt from the excitation signal generator 30. The resolver 20 outputs two-phase resolver detection signals sin θ sin(ωt+Δω) and cos θ sin(ωt+Δω) to the angle calculation section 40 and also to the reference signal generator 50, where Δω indicates the phase difference of the detection signals output from the resolver 20 with respect to the excitation signal sin ωt. The angle calculation section 40 and the reference signal generator 50 constitute an angle converter 60.

The configuration of the angle calculation section 40 will be described first.

The angle calculation section 40 includes a first multiplier 41, a second multiplier 42, a subtractor 43, a synchronous detection circuit 44, a controller 45, a sine ROM 46, and a cosine ROM 47. The angle calculation section 40 converts the detection angle θ obtained from the resolver detection signals sin θ sin(ωt+Δω) and cos θ sin(ωt+Δω) to a digital output angle φ and outputs it. The sine ROM 46 and the cosine ROM 47 store the values of sin φ and cos φ at each angle φ in tables.

The sine ROM 46 outputs the sine value sin φ at a given digital output angle φ to the multiplier 42. The cosine ROM 47 outputs the cosine value cos φ at the given digital output angle φ to the multiplier 41.

The multiplier 41 multiplies the resolver detection signal sin θ sin(ωt+Δω) by cos φ and sends the product sin θ sin(ωt+Δω)cos φ to the subtractor 43. The multiplier 42 multiplies the resolver detection signal cos θ sin(ωt+Δω) by sin φ and sends the product cos θ sin(ωt+Δω)sin φ to the subtractor 43. The subtractor 43 subtracts the output of the multiplier 42, cos θ sin(ωt+Δω)sin φ, from the output of the multiplier 41, sin θ sin(φt+Δω)cos φ, and sends the difference, sin(θ−φ)sin(ωt+Δω), to the synchronous detection circuit 44.

The synchronous detection circuit 44 refers to a reference signal $S_R$=sin(ωt+Δω) received from the reference signal generator 50 to synchronously detect the output of the subtractor 43, sin(θ−φ)sin(ωt+Δω), and sends the detection output, a control deviation sin(θ−φ), to the controller 45. The controller 45 controls the digital output angle φ so as to make the control deviation sin(θ−φ) zero. With this operation, the detection angle θ is converted to the digital output angle φ.

Next, the configuration of the reference signal generator 50 will be described.

The reference signal generator 50 includes a first multiplier 51, a second multiplier 52, and an adder 53.

The multiplier 51 multiplies the resolver detection signal sin θ sin(ωt+Δω) by sin φ obtained from the sine ROM 46 of the angle calculation section 40 and outputs the product, sin φ sin θ sin(ωt+Δω), to the adder 53. The multiplier 52 multiplies the resolver detection signal cos θ sin(ωt+Δω) by cos φ obtained from the cosine ROM 47 of the angle calculation section 40 and outputs the product, cos φ cos θ sin(ωt+Δω), to the adder 53.

The adder 53 adds the output of the multiplier 51, sin φ sin θ sin(ωt+Δω), and the output of the multiplier 52, cos φ cos θ sin(ωt+Δω), and outputs the following sum.

$$(\cos\theta\cos\phi+\sin\theta\sin\phi)\sin(\omega t+\Delta\omega)=\cos(\theta-\phi)\sin(\omega t+\Delta\omega) \quad (1)$$

Because θ equals φ when the tracking loop achieves tracking, this equation can be written as follows:

$$\cos(\theta-\phi)\sin(\omega t+\Delta\omega)=\sin(\omega t+\Delta\omega)$$

The reference signal generator 50 outputs sin(ωt+Δω), generated in this manner, as the reference signal $S_R$ to the synchronous detection circuit 44 of the angle calculation section 40. With the use of this reference signal $S_R$=sin(ωt+Δω), the synchronous detection circuit 44 can perform detection exactly synchronous with the resolver detection signals in terms of the phase Δω to obtain sin(θ−φ) as a synchronous detection output.

As described above, in this case, the reference signal $S_R$=sin(ωt+Δω) is generated by the multiplications and additions of sin φ and cos φ obtained from the sine ROM 46 and the cosine ROM 47 of the angle calculation section 40 of a tracking loop type and the two-phase resolver detection signals sin θ sin(ωt+Δω) and cos θ sin(ωt+Δω).

More specifically, because the reference signal $S_R$=sin(ωt+Δω) is theoretically generated by calculations, not by extraction from the resolver detection signals with waveform manipulation or at zero crossing timing, the reference signal $S_R$ has exactly the same phase as the resolver detection signals.

In this case, correct synchronous detection is performed without any phase difference under the condition θ=φ when the tracking loop achieves tracking. While the operation is starting, in other words, when the tracking loop has not yet achieved tracking, however, synchronous detection is performed with a phase difference, thus taking some time until the tracking loop achieves tracking.

Figure 2:
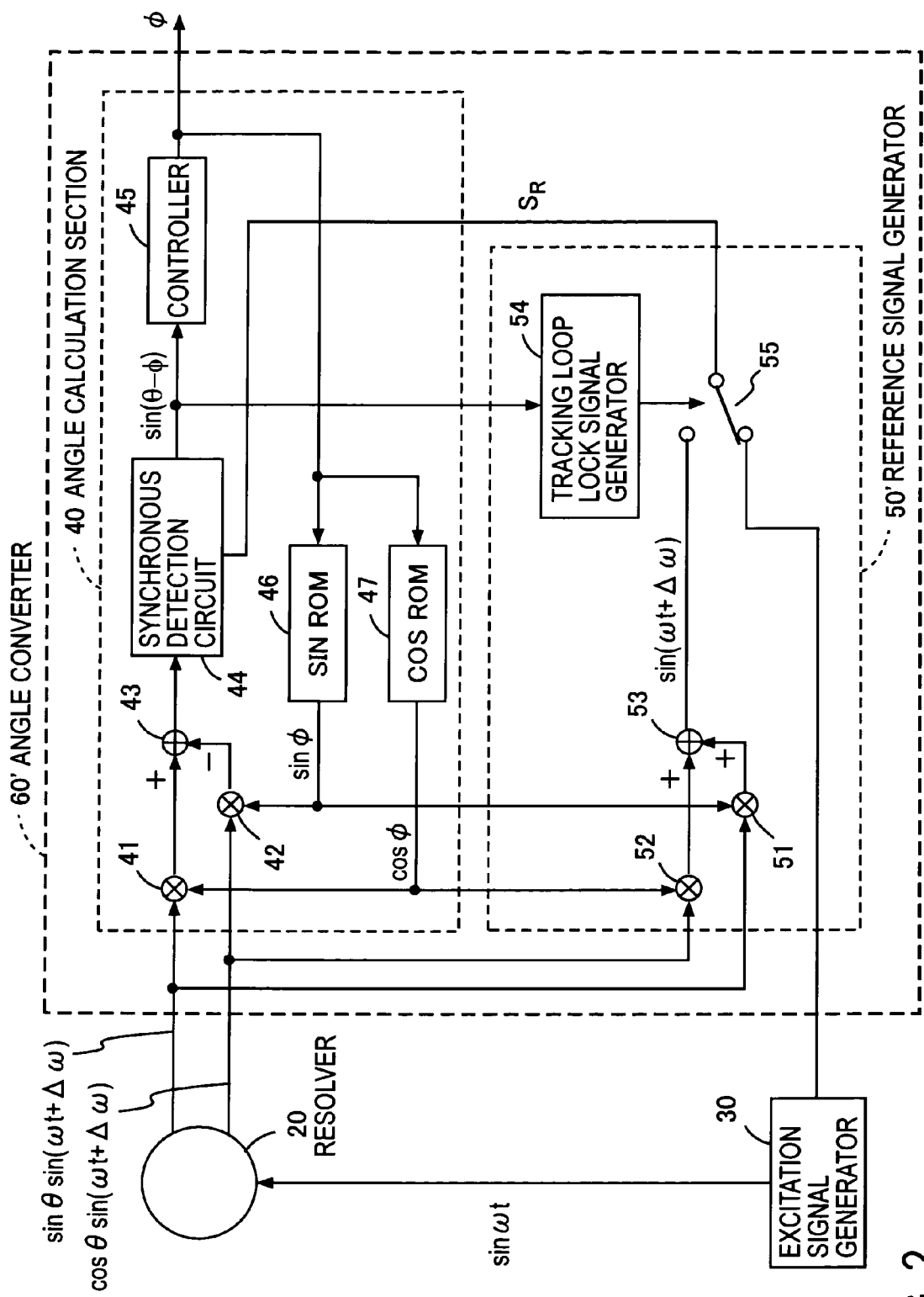
FIG. 2 is a block diagram showing a reference signal generation circuit according to a second embodiment of the present invention.

FIG. 2 shows a reference signal generator 50' according to another embodiment of the present invention, together with a resolver 20, an excitation signal generator 30, and an angle calculation section 40. In FIG. 2, the above described drawback is solved. When the tracking loop has not yet achieved tracking, synchronous detection is performed with an excitation signal sin ωt to give priority to tracking. When the tracking loop has achieved tracking, synchronous detection is performed with a reference signal $S_R$ whose phase is exactly the same as the resolver detection signals.

In FIG. 2, the reference signal generator 50' has a tracking loop lock signal generator 54 and a switch 55 in addition to the components of the reference signal generator 50, shown in FIG. 1. The tracking loop signal generator 54 compares the absolute value of a control deviation output from the angle calculation section 40 with a predetermined value and outputs the result.

The switch 55 is connected to the output of an adder 53 and an excitation signal sin ωt sent from the excitation signal generator 30. Based on the output of the tracking loop lock signal generator 54, the switch 55 switches between the output of the adder 53 and the excitation signal sin ωt. The output of the switch 55 is input to a synchronous detection circuit 44 of the angle calculation section 40 as a reference signal $S_R$.

More specifically, in this case, a signal indicating whether the tracking loop has achieved tracking is generated by the tracking loop lock signal generator 54 and used as the switching condition of the switch 55. With this configuration, when the tracking loop has achieved tracking, synchronous detection is performed with the output of the adder 53, that is, the reference signal $S_R=\sin(\omega t+\Delta\omega)$ whose phase is exactly the same as an excitation signal component $\sin(\omega t+\Delta\omega)$ included in the resolver detection signals. When the tracking loop has not yet achieved tracking, synchronous detection is performed with the excitation signal sin ωt being used as the reference signal $S_R$ to give priority to tracking.

In the tracking loop lock signal generator 54, the predetermined value to be compared with the absolute value of the control deviation $\sin(\theta-\phi)$ is, for example, set to 30 degrees. In other words, the angle deviation used to determine whether the tracking loop has achieved tracking, $|\theta-\phi|$, is equal to or smaller than 30 degrees. When it is expressed in terms of control deviation, $|\sin(\theta-\phi)|$ is equal to or smaller than 0.5. Within this angle deviation, the switch 55 outputs the output of the adder 53 as the reference signal $S_R$. When $|\theta-\phi|$ is larger than 30 degrees, that is, when the control deviation $|\sin(\theta-\phi)|$ is larger than 0.5, the switch 55 outputs the excitation signal sin ωt as the reference signal $S_R$.

According to the reference signal generator 50', shown in FIG. 2, even when the tracking loop has not yet achieved tracking in a transition period, such as when $|\theta-\phi|$ is larger than 30 degrees, the tracking loop soon achieves tracking and θ becomes equal to φ. Therefore, the reference signal $S_R$ having exactly the same phase as the resolver detection signals can be obtained.

Figure 3:
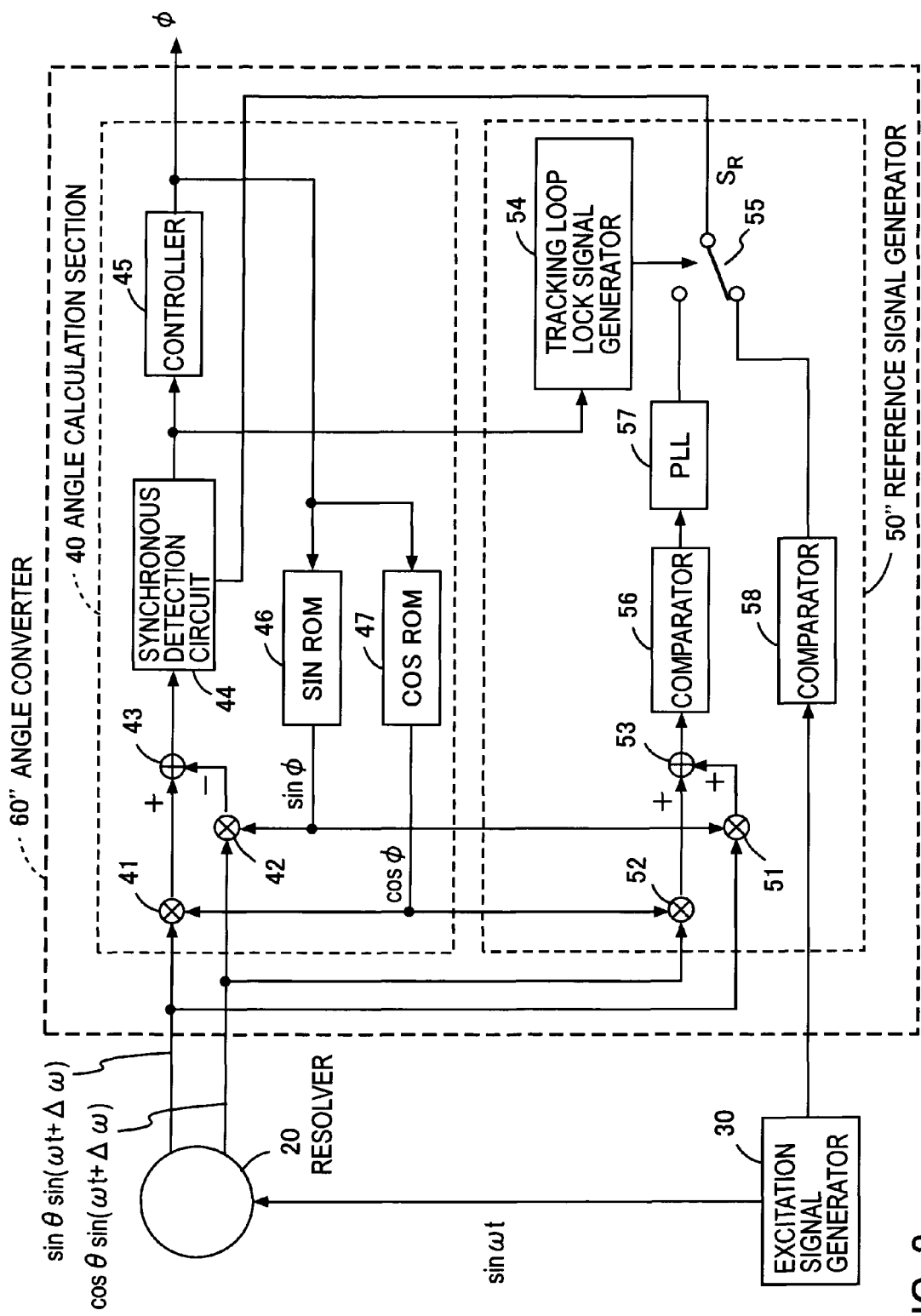
FIG. 3 is a block diagram showing a reference signal generation circuit according to a third embodiment of the present invention.

FIG. 3 shows a reference signal generator 50'' according to still another embodiment of the present invention, together with a resolver 20, an excitation signal generator 30, and an angle calculation section 40. In FIG. 3, the reference signal generator 50'' includes a first comparator 56, a phase locked loop (hereinafter called PLL) 57, and a second comparator 58, in addition to the components of the reference signal generator 50', shown in FIG. 2.

A signal $\sin(\omega t+\Delta\omega)$ output from an adder 53 is converted to a rectangular wave signal by the first comparator 56. The rectangular wave signal is used by the PLL 57 to generate a rectangular wave signal having the same phase, and this rectangular wave signal is sent to a switch 55. The second comparator 58 converts an excitation signal sin ωt to a rectangular wave signal and sends the rectangular wave signal to the switch 55.

In an actual environment, it is expected that the resolver detection signals include noise. Therefore, when a method for generating a reference signal from the resolver detection signals is used, it is inevitable that noise causes the reference signal to have a phase fluctuation.

In contrast, in the current case, the rectangular wave signal generated from $\sin(\omega t+\Delta\omega)$ passes through the PLL 57. Therefore, noise included in the resolver detection signals is prevented from causing phase fluctuation of the reference signal $S_R$, providing a highly noise immune, stable reference signal $S_R$.

Figure 4:
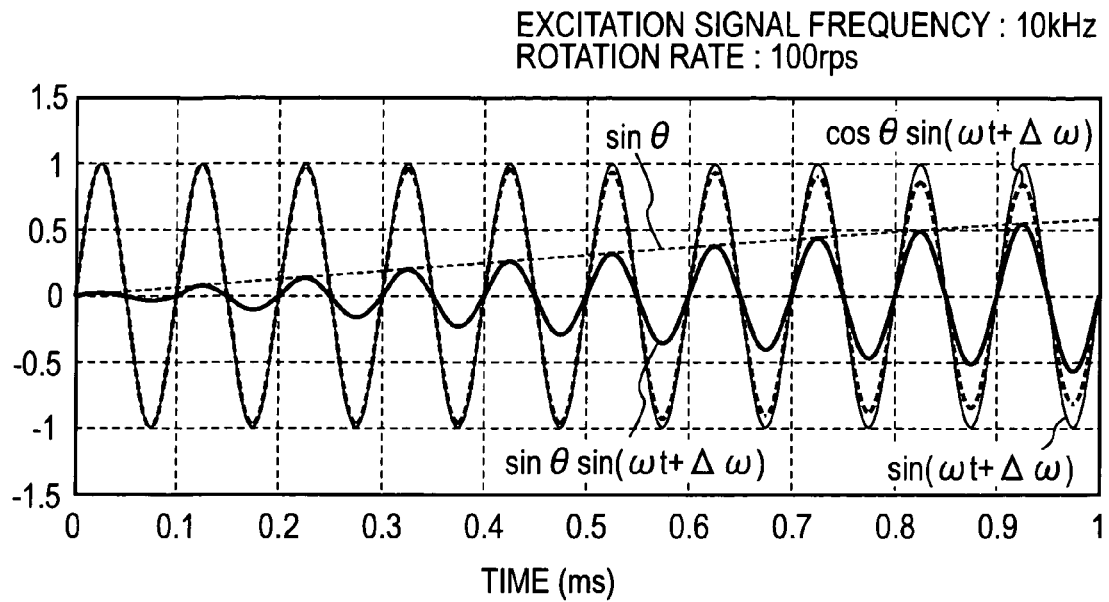
FIG. 4 is a diagram showing waveforms at a low rotation speed.
Figure 5:
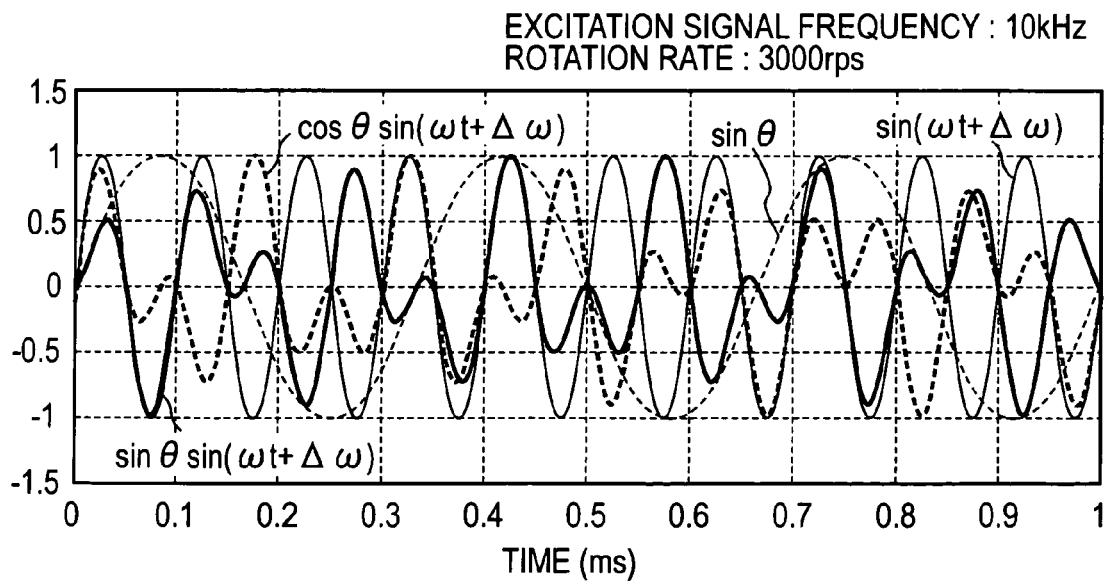
FIG. 5 is a diagram showing waveforms at a high rotation speed.

FIG. 4 and FIG. 5 show signal waveforms obtained at a low rotation rate (100 rps) and at a high rotation rate (3,000 rps) with the frequency of an excitation signal being set to 10 kHz.

At the low rotation rate, the resolver detection signals sin θ $\sin(\omega t+\Delta\omega)$ and cos θ $\sin(\omega t+\Delta\omega)$ differ only in amplitude from the sin ωt signal, as shown in FIG. 4. It is understood that the reference signal can be generated from the resolver detection signals. In contrast, at the high rotation rate, the zero crossing points of the resolver detection signals and the zero crossing points of the excitation signal component $\sin(\omega t+\Delta\omega)$ do not match in timing, as shown in FIG. 5.

Figure 6:
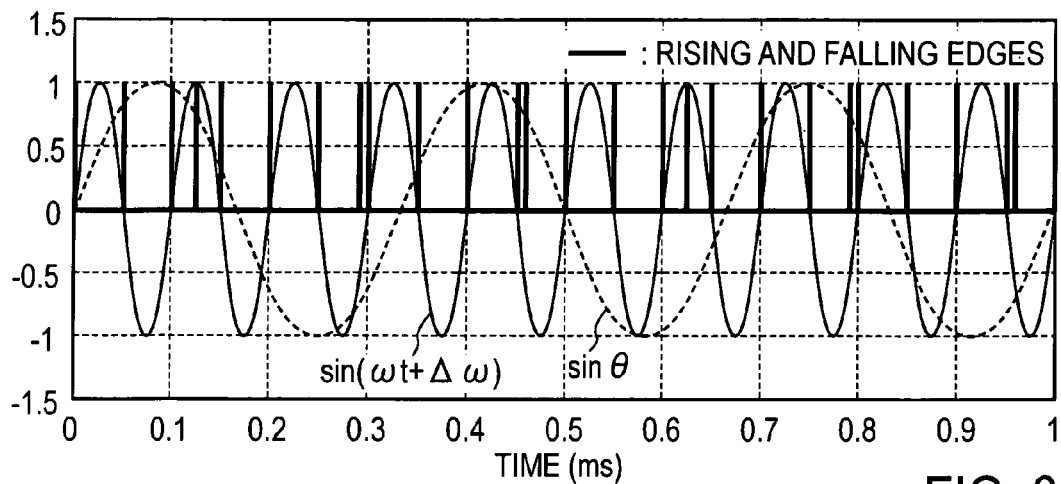
FIG. 6 is a diagram showing rising and falling edges when conventional rising and falling edge detection is applied to the case shown in FIG. 5.
Figure 7:
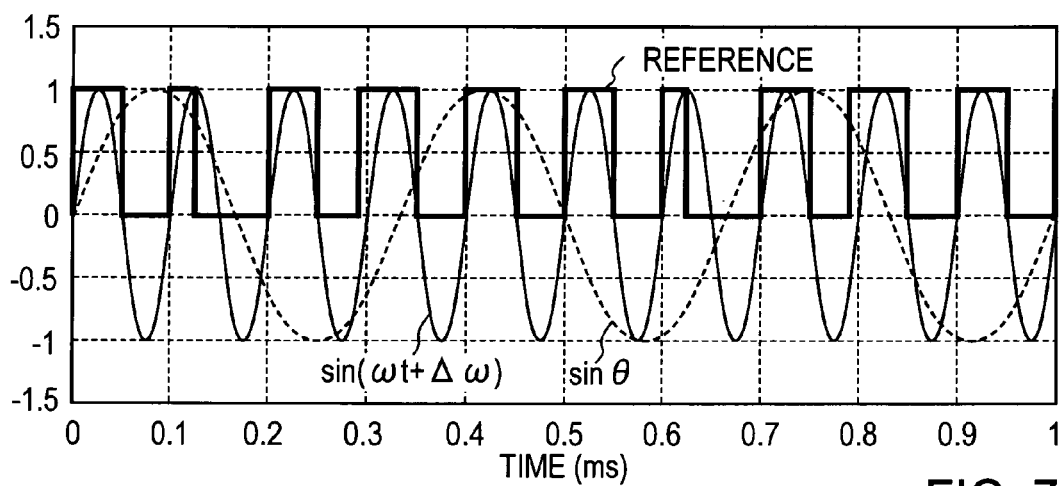
FIG. 7 is a diagram showing the waveform of a reference signal generated from edge detection shown in FIG. 6 in the conventional method.

When rising edge and falling edge detection, performed in Japanese Registered Patent No. 3,442,316, described above, is applied to the resolver detection signals sin θ $\sin(\omega t+\Delta\omega)$ and cos θ $\sin(\omega t+\Delta\omega)$ shown in FIG. 5, the edges are detected as shown in FIG. 6. Because the conventional method described in Japanese Registered Patent No. 3,442,316 uses the edges as triggers to generate the reference signal, the reference signal has the phase and duty cycle shown in FIG. 7, which are not uniform. In other words, when a method similar to that disclosed in Japanese Registered Patent No. 3,442,316 is used, a high rotation rate cannot be handled.

Figure 8:
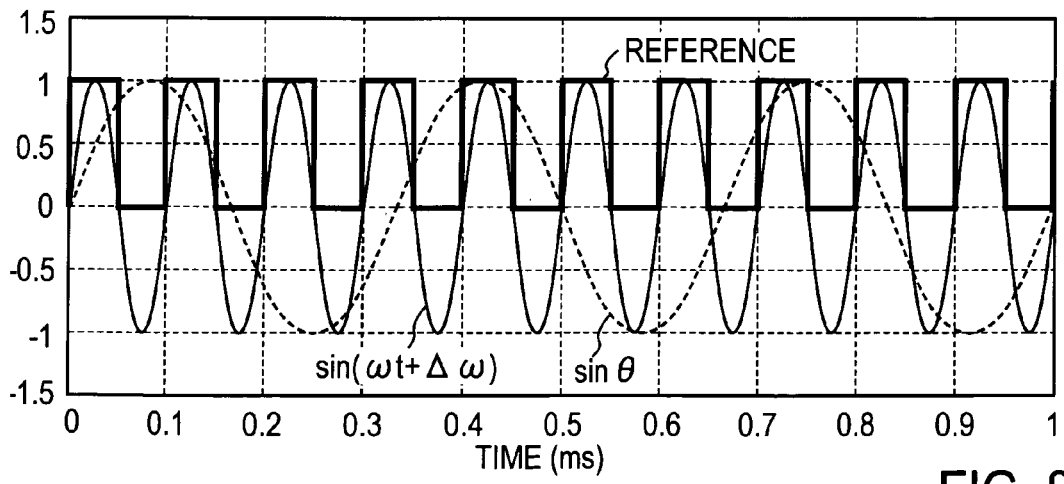
FIG. 8 is a diagram showing the waveform of a reference signal in the present invention.
Figure 9:
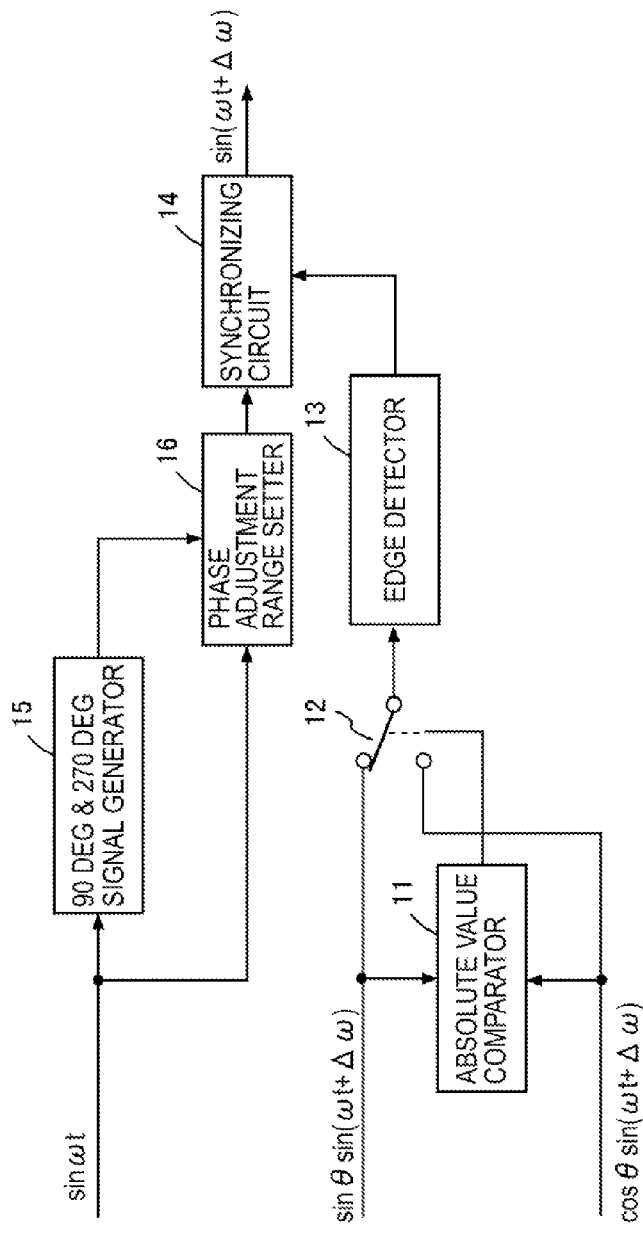
FIG. 9 is a block diagram showing a conventional reference signal generation method.

In contrast, according to the present invention, a reference signal having a uniform phase and duty cycle can be generated, as shown in FIG. 8, even at a high rotation rate (3,000 rps).

What is claimed is:

1. A reference signal generation circuit for generating a reference signal used in synchronous detection for removing an excitation signal component in an angle calculation section that converts a detection angle θ obtained from two-phase resolver detection signals output from a resolver excited by an excitation signal sin ωt, to a digital output angle φ, the reference signal generation circuit comprising:

a first multiplier for multiplying a first resolver detection signal sin θ $\sin(\omega t+\Delta\omega)$, where Δω indicates a phase difference between the excitation signal and the excitation signal component, by the sine value sin φ of the digital output angle φ obtained from the angle calculation section;

a second multiplier for multiplying a second resolver detection signal cos θ $\sin(\omega t+\Delta\omega)$ by the cosine value cos φ of the digital output angle φ obtained from the angle calculation section; and an adder for adding the output of the first multiplier and the output of the second multiplier to output the sum signal $\sin(\omega t+\Delta\omega)$ as the reference signal.

2. The reference signal generation circuit according to claim 1, further comprising:

a tracking loop lock signal generator adapted to compare the absolute value of a control deviation obtained from the angle calculation section with a predetermined value to output a comparison result; and a switch for switching between the output $\sin(\omega t+\Delta\omega)$ of the adder and the excitation signal $\sin \omega t$, based on the output of the tracking loop lock signal generator;

wherein $\sin(\omega t+\Delta\omega)$ and $\sin \omega t$ are switched between based on the magnitude of the control deviation and are output as the reference signal.

3. The reference signal generation circuit according to claim 2, further comprising:

a first comparator adapted to shape the output $\sin(\omega t+\Delta\omega)$ of the adder to a rectangular wave signal;

a phase synchronizing circuit adapted to generate a rectangular wave signal having the same phase as the output of the first comparator to send the rectangular wave signal to the switch; and a second comparator adapted to shape the excitation signal $\sin \omega t$ to a rectangular wave signal and to send the rectangular wave signal to the switch.

4. An angle converter comprising:

an angle calculation section adapted to convert a detection angle $\theta$ obtained from two-phase resolver detection signals output from a resolver to a digital output angle $\phi$; and a reference signal generation circuit according to one of claims 1 to 3.

5. An angle detection apparatus comprising:

a resolver adapted to output two-phase detection signals;

an angle converter according to claim 4; and an excitation signal generator adapted to send an excitation signal $\sin \omega t$ to the resolver.

* * * * *